United States Patent
Wallis

(10) Patent No.: US 7,323,764 B2
(45) Date of Patent: Jan. 29, 2008

(54) BUFFER STRUCTURE FOR MODIFYING A SILICON SUBSTRATE

(75) Inventor: David J Wallis, Malvern (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 10/545,911

(22) PCT Filed: Feb. 16, 2004

(86) PCT No.: PCT/GB2004/000560

§ 371 (c)(1),
(2), (4) Date: Aug. 17, 2005

(87) PCT Pub. No.: WO2004/075249

PCT Pub. Date: Sep. 2, 2004

(65) Prior Publication Data

US 2006/0145186 A1    Jul. 6, 2006

(30) Foreign Application Priority Data

Feb. 19, 2003  (GB) .................... 0303784.3

(51) Int. Cl.
    *H01L 29/12* (2006.01)
(52) U.S. Cl. ........................................ 257/613
(58) Field of Classification Search ........ 257/190, 257/191, 200–201, 18, 189; 438/46, 240, 438/478
    See application file for complete search history.

(56) References Cited

U.S. PATENT DOCUMENTS

| | | | |
|---|---|---|---|
| 5,998,232 A * | 12/1999 | Maruska | 438/46 |
| 6,171,898 B1 * | 1/2001 | Crenshaw et al. | 438/240 |
| 6,472,694 B1 * | 10/2002 | Wilson et al. | 257/189 |
| 2002/0031851 A1 | 3/2002 | Linthicum et al. | |
| 2002/0187356 A1 | 12/2002 | Linthicum et al. | |
| 2003/0017683 A1 * | 1/2003 | Emrick et al. | 438/478 |

FOREIGN PATENT DOCUMENTS

| | | |
|---|---|---|
| JP | 50-102581 | 8/1975 |
| WO | 95/17019 | 6/1995 |
| WO | 99/18617 | 4/1999 |

OTHER PUBLICATIONS

GB Search Report for 0303784.3 dated Jul. 31, 2003.
International Search Report for PCT/GB2004/000560 dated Sep. 1, 2004.
Liu et al., *Substrates for gallium nitride epitaxy*, Materials Science and Engineering R 37, 2002, pp. 61-127.
Perjeru et al., *ScN/GaN heterojunctions: fabrication and characterization*, Applied Surface Science, vols. 175-176, May 15, 2001, pp. 490-494.
Kaplan et al., *Growth and properties of scanidum epitaxial films on GaN*, Appl. Phys. Lett., vol. 68, No. 23, Jun. 3, 1996, pp. 3248-3250.

* cited by examiner

*Primary Examiner*—Jerome Jackson
*Assistant Examiner*—Jami M Valentine
(74) *Attorney, Agent, or Firm*—Nixon & Vanderhye PC

(57) ABSTRACT

A buffer structure comprising a compositionally graded layer of a nitride alloy comprising two or more Group IIIB elements, for example La, Y, Sc or Ac, is used to modify a silicon substrate to produce a universal substrate on which a range of target materials, for example GaN, may be deposited to produce semiconductor devices for electronic and optical applications. The resulting lattice parameter L varies with thickness T through the structure.

15 Claims, 2 Drawing Sheets

BUFFER STRUCTURE FOR MODIFYING A SILICON SUBSTRATE

Figures 1A, 1B:
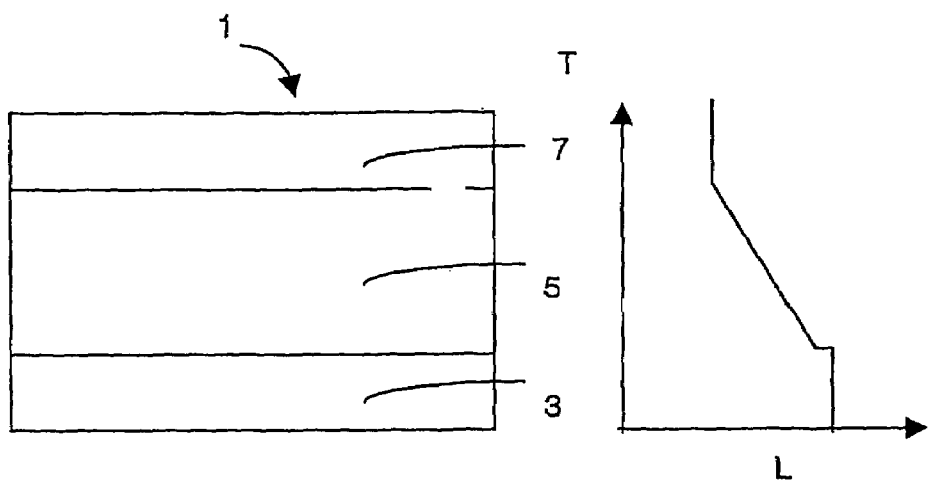

This application is the U.S. national phase of international application PCT/GB2004/000560 filed 16 Feb. 2004 which designated the U.S. and claims benefit of GB 0303784.3, filed 19 Feb. 2003, the entire contents of each of which are hereby incorporated by reference.

The present invention relates to a buffer structure for modifying a silicon substrate for subsequent deposition of a target material, precursor device structures and devices incorporating said buffer structures and methods for forming said structures and devices. It is particularly concerned with buffer structures suitable for the growth of target materials such as, for example, Group III-V semiconductors or perovskite oxides on Si, and has especial application to gallium nitride materials.

Gallium nitride materials are semiconductor compounds having a number of attractive properties making them useful in many microelectronic applications. Generally, they need to be grown as a single crystal (epitaxial) layer on a suitable substrate, with the substrate influencing the epitaxial growth mechanism. Although it would be desirable to grow single crystal layers in commercial quantities on bulk substrates, suitable substrates for heteroepitaxial growth are hard to identify.

Sapphire ($Al_2O_3$), silicon carbide and silicon have all been used as substrates for gallium nitride deposition, but differences in the respective properties of the substrate and target materials can limit the quality of the resulting layers. GaN has a different thermal coefficient of expansion from the above substrates, and hence, upon cooling after processing, the GaN layers have a tendency to crack due to the constraints placed upon them by the thicker substrate layers. Cracking in gallium nitride layers severely limits their end use applications.

Another problem is that for high quality epitaxial growth to occur, the crystal lattice parameters of the substrate and target material must be identical or reasonably close. The substrate surface structure and orientation strongly influences the resulting target material layer and, if there is not a good lattice parameter match, this will lead to the formation of numerous dislocations and to a loss of fine control of the target material structure. The formation of such defects detrimentally affects the resulting electronic and/or optical properties of the single crystal and again limits the end use applications.

Prior art techniques have been developed for preventing crack formation and defect formation, including ones involving the use of transition or buffer layers. One strategy for the reduction of threading dislocations in heteroepitaxial systems is the use of an amorphous, or polycrystalline, buffer layer. For example, in the Motorola TFOS (Three Fives on Silicon) process, a coherent single crystal oxide film is deposited onto the substrate. Before the "critical thickness" of this oxide is reached (at which thickness numerous defects appear), the substrate to film interface is converted to an amorphous layer which, for certain materials, absorbs the misfit strain and results in low dislocation densities. The requirement for the oxide layer to be coherent before the strain relief occurs limits this approach to layers within a range of mismatches +/−5-7% (at which mismatch the critical thickness drops below one atomic monolayer).

It has also been shown that the use of transition or buffer layers with graded or stepped composition may be used to realise high quality heteroepitaxial structures. The role of the graded or stepped layers is to introduce strain gradually, and thus provide an opportunity for dislocations to move. This, in turn, reduces the number of dislocations that penetrate the layer surface, by extending the length of each misfit dislocation and promoting the annihilation of their threading segments. Prior art techniques using transition layers for the direct epitaxial growth of gallium nitride materials on silicon, have employed layers comprising compositionally graded Al and In alloys of GaN, but with limited success.

Due to the significant technological interest in GaN and other Group III-V semiconductors, several alternative technologies have been developed for the growth of GaN on a Si substrate, despite 17% lattice mismatch. These include the techniques of pendoepitaxy and Epitaxial Lateral Overgrowth (ELOG), where GaN is grown on patterned substrates, and the so-called Nitronex process, where the Si substrate is first converted to SiC, by annealing in ethylene, prior to GaN growth. However, whilst all of these processes have successfully demonstrated GaN growth on Si layers, defect densities are still significantly higher than required and the pre-processing of substrates adds significantly to production costs.

In a first aspect of the present invention, there is provided a buffer structure for modifying a silicon substrate for subsequent deposition of a target material, the buffer structure comprising a compositionally graded buffer layer comprising a Group IIIB nitride alloy, said alloy comprising two or more Group IIIB elements, the relative amounts of which vary with depth to achieve said grading.

The term Group IIIB is used herein to refer to the rare-earth elements Sc, Y, La and Ac; those elements have, under some alternative practices, also been known as Group IIIA elements.

The term Group III-V semiconductor is generally used to refer to compounds of B, Al, Ga, In or Tl with N, P, As, Sb or Bi.

Epitaxial deposition of GaN alloys and other Group III-V semiconductors on Si poses a considerable challenge due to the above-mentioned high degree of lattice mismatch between silicon and those materials, as well as differing thermal expansivities. We have found that the physical properties and crystal structures of the Group IIIB nitrides make them particularly suitable for providing graded buffer structures on silicon that allow high quality target material layers to be deposited. Moreover, within the Group IIIB nitrides there is sufficient diversity of lattice parameters within their respective cubic structures to facilitate the production of a 'universal', silicon-based substrate for epitaxial growth, that is, one which is capable of being adapted to suit a wide range of target materials. Thus, the present invention provides a buffer structure suitable for the growth of high quality GaN, as well as a substrate structure capable of adapting to a wide range of other target materials, including other Group III-V semi-conductors and technologically important materials such as perovskite oxides.

In a further aspect of the invention, there is provided a crystal structure in which the aforementioned buffer structure is provided upon a silicon substrate, and also a crystal structure comprising the aforementioned buffer structure and a layer of target material provided thereon. A semiconductor device including such a crystal structure is also provided.

In yet a further aspect, there is provided a method for forming a buffer structure for modifying a silicon substrate for subsequent deposition of a target material, the method comprising growing a compositionally graded buffer layer comprising a Group IIIB nitride alloy upon a silicon substrate, said alloy comprising two or more Group IIIB elements, the relative amounts of which vary with depth to achieve said grading.

In a preferred aspect, there is provided a buffer structure for modifying a silicon substrate for subsequent deposition of a target material, the buffer structure comprising a compositionally graded buffer layer comprising a lanthanum nitride alloy, said alloy further comprising one or more further elements from Group IIIB to achieve said grading.

Figures 2A, 2B:
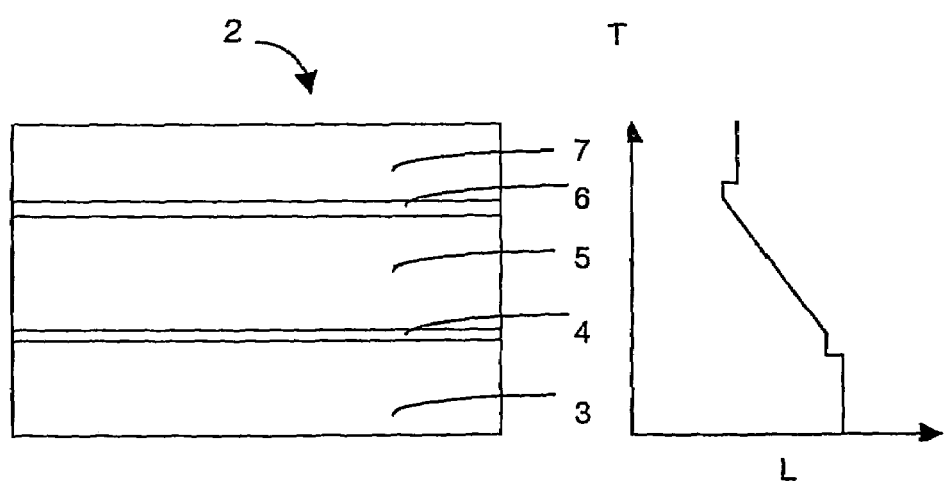

The invention will now be described in more detail, with reference to the accompanying drawings in which:

FIG. 1*a* is a schematic cross-sectional view of a preferred crystal structure according to the present invention, and FIG. 1*b* alongside it shows the resulting lattice parameter L with thickness T through the structure;

FIG. 2*a* is a schematic cross-sectional view of a second crystal structure according to the present invention, and FIG. 2*b* alongside it again shows the resulting lattice parameter L with thickness T through the structure; and, FIGS. 3*a* to 3*g* show exemplary profiles of the variation of concentration x with thickness t for alternative buffer structures according to the present invention.

We have found that a buffer structure comprising a compositionally graded layer of an alloy comprising two or more Group IIIB elements (La, Y, Sc, or Ac) may be used to modify a silicon substrate to produce a highly adaptable buffer structure on which a range of target materials (e.g. GaN) may be deposited to produce semiconductor devices for electronic and optical applications.

LaN, ScN and YN are all semi-metals, or narrow gap semiconductors (ScN, for example, has a band-gap around 2.2 eV). Thus, buffer structures according to the present invention can, according to choice, be made conducting, for example in LED applications, where electrical contacts to the bottom of a device are required, or, alternatively, highly resistive, for example in microwave FET applications.

As used herein, the term "silicon substrate" refers to any substrate that includes a layer of single crystal silicon, including, for example, bulk silicon wafers, silicon-on-insulator substrates, silicon-on-sapphire substrates, SIMOX substrates and substrates that have a silicon wafer bonded to another polycrystalline material.

Where a structure, or layer, is described as being upon a substrate, or other layer, said structure, or layer, may be disposed directly above the whole or part of said substrate, or other layer, or indirectly, if an intermediate layer is also present.

In the "compositionally graded" buffer layer, the relative amounts of the respective Group IIIB elements will change with depth in the buffer layer, throughout at least a portion of the thickness of the buffer layer. The relative amounts may change so as gradually to reduce the lattice parameter with distance from the silicon substrate, having regard to the lattice parameters of the respective pure individual Group IIIB nitrides (eg that of LaN or ScN). At the very least, there will be two different compositions existing at different depths within that layer. Usually, however, there will be a gradual variation in the relative concentrations of the respective La, Sc, or Y atoms in the single crystal or lattice.

In contrast with prior art buffer systems, which tend to use buffer layers with alloys such as InN or AlN which have crystal structures compatible with that of the target, GaN (Wurzite), to absorb the misfit strain, the present invention is based on the growth of a compositionally graded buffer layer comprising elements from a different periodic group, Group IIIB. The resulting nitride alloy lattice has a different crystal structure (Cubic NaCl) which can achieve a large variation in lattice parameter depending on the grading, as well as close lattice matches with Si and also GaN, as described further below.

In addition, because the Group IIIB elements are significantly less electropositive than silicon, they form nitrides in preference to SiN. Thus, during the initial crystal growth phase, it is easier (than in prior art processes) to take steps to prevent the formation of silicon nitride on the exposed substrate (which nitride is amorphous and disturbs the epitaxial relationship between substrate and heteroepitaxial layers), leading to a simplified, lower cost manufacturing process.

The alloy may contain at least two Group IIIB elements selected from lanthanum, scandium, and yttrium. LaN, YN and ScN all have a cubic (NaCl) crystal structure with lattice parameters of 0.530 nm for LaN, 0.489 nm for YN and 0.445 nm for ScN; silicon has a corresponding lattice parameter of 0.5431 nm. Thus, growth on the Si surface may commence with a starting composition for the buffer layer of pure LaN or pure YN, for example, or, with LaYN or LaScN or YScN or LaYScN but with a high concentration, of more than say 75%, and preferably 90% or more of the element with the larger nitride parameter; thereafter the amounts of the other element(s) may be increased until the amount of the larger parameter element drops to 25% or less, preferably 10% or less. LaN, in particular, gives an especially good lattice match, making it possible to achieve much lower dislocation densities, and hence, higher quality epitaxial layers on Si than have previously been possible. Where GaN is the target material, dislocation densities of less than $10^8$ cm$^{-2}$ may be achieved, as well as RMS [Route Mean Square] surface roughness values of less than 1 nm.

FIG. 1*a* shows a preferred embodiment, where an epilayer of La$_{(1-x)}$Sc$_x$N (0<x<1) is deposited on a single crystal silicon substrate, where x increases with distance away from the substrate to provide a compliant substrate suitable for epitaxial growth of a Group III-V compound. The crystal structure 1 includes the silicon substrate 3, the compositionally graded La$_{(1-x)}$Sc$_x$N buffer layer 5, and the target material layer 7 of GaN. FIG. 1*b* shows how the composition has been graded (from x=0 to x=1) to give a continuous variation in lattice parameter L with thickness T through the buffer layer. Thus, by utilising a graded layer technique, it is possible to produce a buffer layer or "compliant substrate" capable of matching with any cubic lattice parameter between approximately 0.530 nm and approximately 0.445 nm, and any hexagonal lattice parameter between approximately 0.3748 nm and 0.3146 nm. Thus, the present invention facilitates the growth of any nitride or oxide target material with cubic or hexagonal crystal structures capable of matching template growth planes within the Group IIIB nitride cubic structures. The composition may be graded so as to produce a selected lattice parameter at the outer surface (or outermost surface region) of the buffer layer that matches that of the desired target material within 2%, and preferably within 1% and most preferably within 0.1%.

The alloy may be selected from the group consisting of La$_{(1-x)}$Sc$_x$N (0<x<1), La$_{(1-y)}$Y$_y$N (0<y<1), Y$_{(1-z)}$Sc$_z$N (0<z<1), and La$_{(1-x-y)}$Sc$_x$Y$_y$N (0<x<1, 0<y<1, x+y<1). The use of a graded LaScN alloy provides an especially adaptable buffer structure, with a lanthanum rich region of the buffer layer arranged adjacent to the silicon substrate and altering to a scandium rich region disposed at the opposite face that receives the target material. A graded YScN alloy with Y and Sc rich regions may be similarly employed. ScN has a cubic crystal structure with an interatomic spacing on the (111) surface of 0.3146 nm, which spacing is close to that of GaN, 0.3189 nm. Thus, the present invention may provide an interface suitable for the growth of high quality, monocrystalline GaN, with a low defect density. Where a target material with a larger lattice parameter is required a graded LaYN alloy may suffice.

The composition of the graded buffer layer can be varied in a number of ways, and will be chosen in order to engineer the physical and electronic properties of a particular precursor device structure. Typically the amount of the larger lattice parameter element (e.g. lanthanum and/or yttrium) present in the nitride alloy decreases towards the target material side of the graded layer to be replaced by one or two more smaller nitride lattice parameter elements (e.g. scandium and/or yttrium). The grading may be fine or coarse, and may follow any one or more of a linear profile, stepwise profile and/or curved profile. There may be a continuous variation in composition or there may be one or more discontinuities in grading, which discontinuities may separate regions of fixed concentration and/or regions of varying concentration from one another. The grading may occur across the entire depth or thickness of the compositionally graded layer, or across only a portion of the depth. Preferably, the graded layer comprises at least one region of constant composition, which forces relaxation of the lattice at one or more predetermined points.

Figure 3A:
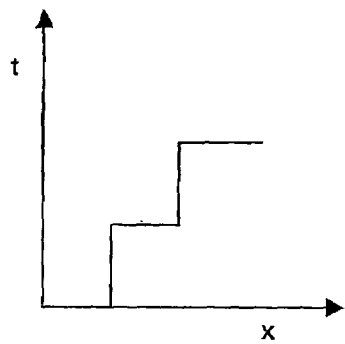
Figure 3B:
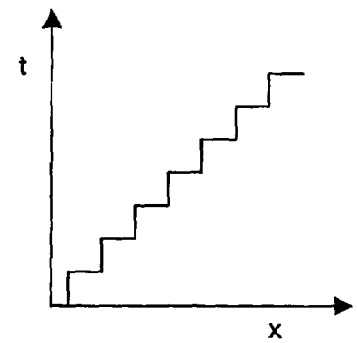
Figure 3C:
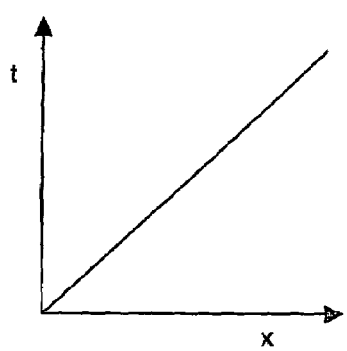
Figure 3D:
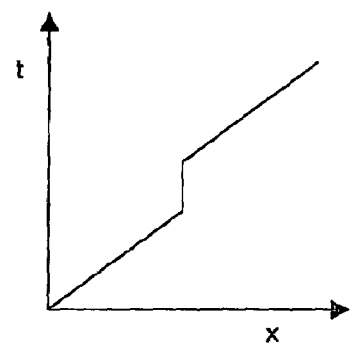
Figure 3E:
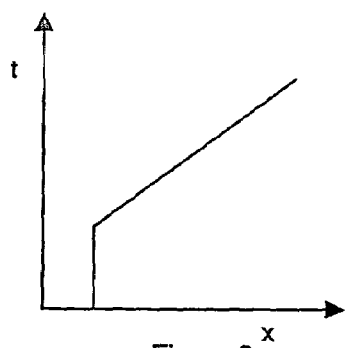
Figure 3F:
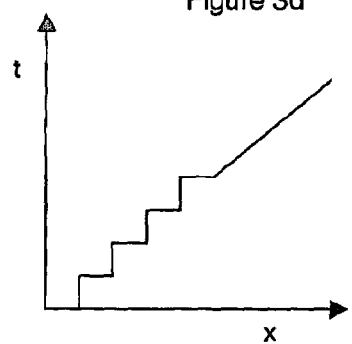
Figure 3G:
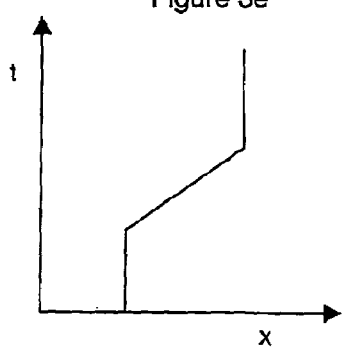

FIGS. 3a to 3f illustrate the manner in which the buffer layer composition x varies with thickness t, by showing typical profiles for the variation of x in a preferred $La_{(1-x)}Sc_xN$ (0<x<1) buffer layer. The amount of scandium may increase from 0% or from a higher % amount e.g. 10%. FIG. 3a shows a stepwise increase in x with thickness or depth, with two steps in concentration, while FIG. 3b shows multiple steps. FIG. 3c shows a linear increase in x with depth, and FIG. 3d shows the same but with an intermediate region of constant composition. In FIG. 3e the initial composition remains constant, before increasing linearly, while in FIG. 3g below, there is additionally a constant composition at the top of the buffer layer. Lastly, FIG. 3f shows a particularly preferred profile involving initial stepwise increases, followed by linear grading at the end. The stepwise increases allow the buffer layer concentration to be built up quickly, with dislocations being generated in, but restricted to the lower regions, while the gentle grading in the upper layers prevents dislocations reaching the surface.

It will be understood that the profiles illustrated in FIGS. 3a to 3f are merely exemplary, and the composition of the graded layer may vary in other ways, for example, depending on the epitaxial growth process used.

The grade rate will depend on the final target material. For GaN, x (or y or z) may vary in the range 4 to 0.2 per micron.

The depth of the buffer layer depends upon the end use application and quality of the target material required. In some cases, for example, the buffer layer may be up to 7 microns, but is preferably in the range 0.5-4 micron and more preferably in the range 1-2 micron. In other cases, for example, the depth of the buffer layer may be <1 micron, preferably 0.1-0.8 micron and more preferably 0.4-0.5 micron.

In some preferred embodiments, there may be at least one intervening layer between the buffer layer and either, or both, of the target material layer and the substrate layer. Such interlayers may form during growth due to diffusion etc, but also different composition layers may have to be introduced for other reasons, for example, below the target layer to help the nucleation of different target materials.

FIG. 2a shows a second crystal structure containing the same layers as in the structure of FIG. 1a, and also comprising a LaN monolayer 4 upon the substrate, as well as a sub-layer of constant composition lanthanum scandium nitride alloy 6 directly underneath the target material layer 7. It may be advantageous in some applications if the buffer layer comprises an initial sub-layer directly upon the substrate, typically 1-2 nm in depth, and typically containing only a nitride of the larger lattice parameter element. Such a sub-layer can provide a pseudomorphic initiation layer, which layer takes the crystal form of the substrate. For a LaScN alloy buffer layer, pure LaN may therefore be used in that sub-layer. Thereafter, strain can be increased gradually by growth of the graded buffer layer.

Ideally, the buffer structure of the present invention is grown on the Si(111) surface of the silicon substrate. For GaN this gives a template with a suitable symmetry for the growth of hexagonal GaN. Alternatively a Si(001) surface may be used for the growth of cubic materials such as the perovskite oxides or Zincblende GaN, InN, AlN and alloys thereof. Buffer layers may also be grown which have a small offcut from the ideal orientation of a selected plane, for example, of up to 5°, preferably up to 1 or 2°, although smaller angles not exceeding 0.1 or 0.5° may be useful in certain instances. Such offcuts permit control of the growth mechanism of the buffer layer and target material to improve properties such as surface morphology.

The Group III-V semiconductors, including the Group III-V nitrides AlN, InN, GaN and their alloys, are of particular interest as heteroepitaxial target materials. Their material properties allow the production of efficient light emitters across a range of wavelengths from red to the UV, and also offer high power, high voltage electronics. Thus, the target material preferably comprises a Group III-V semiconductor, more preferably comprises aluminium, gallium or indium nitride, or alloys thereof, and even more preferably comprises gallium nitride. The present invention provides a particularly suitable growth surface for Wurzite (hexagonal GaN—the most commonly used phase), but cubic (Zinc blende) GaN may also be grown, as well as similarly structured AlN and InN alloys. ScN is a further significant target material.

Another class of materials in which there is significant technological interest is the perovskite structured oxides, thus the target material alternatively comprises a perovskite oxide. Those oxides show a range of interesting material properties, such as, for example, ferro-electricity, Giant Magneto Resistance, high dielectric constant and piezo-electricity, which properties all have device applications. Many perovskite oxides have lattice parameters which are smaller than Si and so require buffer layers to enable high quality epitaxial growth, but lie within the lattice size range achieved by the present invention. Oxides with a spinel type structure may also be grown by the present invention. Examples of possible perovskite oxide target materials would include lead scandium tantalate, lead zirconium titanate, strontium titanate, barium titanate, lanthanum calcium mangenate, lanthanum strontium manganate, lanthanum barium manganate, calcium zirconate, strontium zirconate, barium zirconate, hafnium oxide, hafnium silicate, calcium hafnate, strontium hafnate, and barium hafnate.

The target material may be grown directly upon the buffer layer, thereby driving final relaxation of the graded layer. Alternatively, the buffer structure may further comprise a constant composition layer of, for example, up to 2 microns of the Group IIIB nitride alloy disposed at the top of the buffer layer beneath the target material, which layer forces almost complete relaxation of the lattice prior to growth of the material layer.

The target material may form at least one device layer with the desired electronic and mechanical properties. In some applications, more than one device layer of the same material may be required, in others more than one device layer of different materials may be deposited over the buffer layer. Optionally, the target material is put under compressive strain at the selected growth temperature by grading a topmost region or sub-layer of the buffer layer to a lattice parameter slightly beyond that (e.g. up to 2% larger) of the target material. Indeed, the topmost region may comprise a sub-layer of fixed composition nitride alloy of, for example, up to 1 micron with the required slightly smaller lattice parameter. In this way, it is possible to take advantage of a small difference in lattice parameter between the outer surface of the buffer layer and the material layer, in order that, upon cooling, the disadvantageous thermal expansion mismatch between Si and the target material is offset against the compressive strain. For example, ScN has a slightly smaller lattice parameter than GaN, and, by introducing a degree of compressive strain, the tensile thermal mismatch strain between Si and GaN is reduced, thereby reducing the possibility of cracking of the target layer.

The Group IIIB nitrides may act to a certain extent as a barrier layer preventing the interdiffusion of atomic species between epilayer and substrate. Moreover, the Group IIIB nitrides may be deposited using a variety of known epitaxial growth processes, and have relatively high melting points, providing compatibility with the subsequent growth conditions required for commonly required target materials such as GaN. In the Example that follows molecular beam epitaxy (MBE) is employed to lay down the buffer structure. However, the buffer structure may also be grown using, for example, metal-organic molecular beam epitaxy (MOMBE), metal-organic chemical vapour deposition (MOCVD), plasma enhanced physical vapour deposition (PEPVD), chemical beam epitaxy (CBE), liquid phase epitaxy (LPE) or other techniques that are known to be suitable for epitaxial growth. The technique is preferably selected so that the buffer structure and target material can be deposited using the same equipment, preferably in a single process. Thus, since LaN, ScN and YN may all be grown from hydrogen based precursors, for a GaN alloy target material MOCVD may be conveniently employed.

The buffer structure according to the present invention may be used in a variety of device applications, in technology areas including electronics, opto-electronics, MEMS, photonics, sensors and imaging. Thus, in a further aspect, the invention provides a semiconductor device including the aforementioned crystal/buffer structures. The device may be an optical or electronic device, with common applications including LED's, laser diodes, transistors, etc.

The present invention further provides a silicon substrate, e.g. a silicon wafer, containing one or more buffer structures according to the invention grown by selective area epitaxy on a portion of its surface. Such a buffer structure and its associated target material layer may then be integrated with silicon devices patterned onto the rest of the silicon substrate/wafer.

The device will normally comprise the target material, buffer layer and silicon substrate, but there may be applications where the silicon substrate may be subsequently removed (hence, merely acting as a template), for example, if the present buffer layer is adapted to act itself as a bottom contact for a device.

In yet a further aspect, the present invention provides a single crystal target material obtained using the method of the present invention, which material has been separated from the buffer layer. The single crystal material may be used in a variety of semiconductor, or other, applications, and may be doped to form a material suitable for those applications.

An example of one way of preparing a buffer structure according to the present invention, comprising a graded buffer layer of a La/Sc nitride alloy, is described in the following Example:—

EXAMPLE 1

The native oxide was first stripped from a Si substrate using standard wet chemical processes, ex-vacuo, and a thin, uniform native oxide was allowed to reform on the Si substrate in a controlled manner. The substrate was loaded into an MBE chamber and heated to approximately 950° C. for 30 mins, in order thermally to desorb the reformed native oxide, resulting in a clean (7×7) reconstructed (111) Si surface.

The pre-processed Si substrate was cooled to 700° C., and between 1 and 2 monolayers of La metal were deposited onto the Si surface (so as to prevent nitridation of the Si substrate) using an effusion cell with a typical La flux of 0.3 ml/sec and a background pressure of $10^{-7}$ Torr. The background pressure of the MBE chamber was then increased to $5 \times 10^{-6}$ Torr by bleeding in nitrogen, and the La monolayer was converted to the nitride using an r.f. plasma nitrogen source with a power setting of 500 W.

The La shutter was reopened to initiate growth of a LaN layer of thickness 1-2 nm, and the Sc shutter was then also opened. The growth of a compositionally graded layer of $La_{(1-x)}Sc_xN$ was initiated with a grade rate of approximately x=0.5 per micron, by ramping the La and Sc cells in opposition. The starting flux for the Sc cell was 0.003 ml/sec. During the deposition of the graded layer, the substrate temperature was ramped from 700° C. to 900° C. and nitrogen rich conditions were maintained.

The grading was stopped at a composition providing an appropriate lattice parameter having regard to the desired target material. In this example, in order to provide a lattice match for the subsequent deposition of GaN, the grading of the $La_{(1-x)}Sc_xN$ layer was stopped at a composition of $La_{0.07}Sc_{0.93}N$, and a 0.5 micron layer of constant composition LaScN was then deposited to ensure full relaxation of the film.

A target material layer of GaN was then deposited using a traditional MOCVD process.

The invention claimed is:

1. A buffer structure for modifying a silicon substrate for subsequent deposition of a target material, the buffer structure comprising a compositionally graded buffer layer comprising a Group IIIB nitride alloy, said alloy comprising two or more Group IIIB elements, the relative amounts of which vary with depth to achieve said grading, wherein the alloy contains at least two Group IIIB elements selected from lanthanum, scandium, and yttrium.

2. A buffer structure according to claim 1, wherein the alloy is selected from the group consisting of $La_{(1-x)}Sc_xN$ (0<x<1), $La_{(1-y)}Y_yN$ (0<y<1) $Y_{(1-z)}Sc_zN$ (0<z<1), and $La_{(1-x-y)}Sc_xY_yN$ (0<x<1, 0<y<1, x+y<1).

3. A buffer structure according to claim 2, wherein the alloy is a compositionally graded lanthanum scandium nitride alloy.

4. A crystal structure comprising a buffer structure as claimed in claim 1 and a layer of target material provided upon said buffer layer.

5. A crystal structure according to claim 4, in which a constant composition sub-layer of the Group IIIB nitride alloy is disposed in a topmost region of the buffer layer beneath the target material.

6. A crystal structure according to claim 4, wherein the target material is any oxide or nitride with a cubic or hexagonal crystal structure.

7. A crystal structure according to claim 6, wherein the target material is a Group III-V semiconductor comprising any one of AlN, InN, and GaN, or alloys thereof.

8. A crystal structure according to claim 7, wherein the Group III-V semiconductor comprises gallium nitride.

9. A crystal structure according to claim 4, in which the buffer structure is provided upon a silicon substrate.

10. A crystal structure according to claim 4, wherein the crystal structure is incorporated into a semiconductor device.

11. A method for forming a buffer structure for modifying a silicon substrate for subsequent deposition of a target material, the method comprising growing a compositionally graded buffer layer comprising a Group IIIB nitride alloy upon a silicon substrate, said alloy comprising two or more Group IIIB elements, the relative amounts of which vary with depth to achieve said grading, wherein the alloy contains at least two Group IIIB elements selected from lanthanum, scandium, and yttrium.

12. A method as claimed in claim 11, wherein the alloy is selected from the group consisting of $La_{(1-x)}Sc_xN$ ($0<x<1$), $La_{(1-y)}Y_yN$ ($0<y<1$), $Y_{(1-z)}Sc_zN$ ($0<z<1$), and $La_{(1-x-y)}Sc_xY_yN$ ($0<x<1$, $0<y<1$, $x+y<1$).

13. A method as claimed in claim 12, wherein the alloy is a compositionally graded lanthanum scandium nitride alloy.

14. A method according to claim 11, wherein a layer of target material is subsequently deposited on the buffer structure.

15. A method as claimed in claim 14, comprising further processing steps to form a semiconductor device.

* * * * *